United States Patent
Zitzlsperger et al.

(10) Patent No.: US 10,020,434 B2
(45) Date of Patent: *Jul. 10, 2018

(54) SURFACE-MOUNTABLE OPTOELECTRONIC COMPONENT AND METHOD FOR PRODUCING A SURFACE-MOUNTABLE OPTOELECTRONIC COMPONENT

(71) Applicant: OSRAM Opto Semiconductors GmbH, Regensburg (DE)

(72) Inventors: Michael Zitzlsperger, Regensburg (DE); Harald Jaeger, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 18 days.

This patent is subject to a terminal disclaimer.

(21) Appl. No.: 14/958,740

(22) Filed: Dec. 3, 2015

(65) Prior Publication Data
US 2016/0087182 A1    Mar. 24, 2016

Related U.S. Application Data

(62) Division of application No. 13/702,000, filed as application No. PCT/EP2011/058583 on May 25, 2011, now Pat. No. 9,240,536.

(30) Foreign Application Priority Data

Jun. 15, 2010    (DE) .................. 10 2010 023 815

(51) Int. Cl.
*H01L 33/62* (2010.01)
*H01L 33/48* (2010.01)
(Continued)

(52) U.S. Cl.
CPC ............. *H01L 33/62* (2013.01); *H01L 24/97* (2013.01); *H01L 33/486* (2013.01); *H01L 33/54* (2013.01); *H01L 33/64* (2013.01); *H01L 33/60* (2013.01); *H01L 2224/32245* (2013.01); *H01L 2224/32257* (2013.01); *H01L 2224/48091* (2013.01);
(Continued)

(58) Field of Classification Search
CPC ...... H01L 21/565; H01L 33/486; H01L 33/62
See application file for complete search history.

(56) References Cited

U.S. PATENT DOCUMENTS 6,459,130 B1    10/2002    Arndt et al.
6,803,607 B1    10/2004    Chan et al.
(Continued)

FOREIGN PATENT DOCUMENTS

CN           1825644 A     8/2006
CN         101272901 A     9/2008
(Continued)

*Primary Examiner* — Eugene Lee
(74) *Attorney, Agent, or Firm* — Slater Matsil, LLP

(57) ABSTRACT

A surface-mountable optoelectronic component has a radiation passage face, an optoelectronic semiconductor chip and a chip carrier. A cavity is formed in the chip carrier and the semiconductor chip is arranged in the cavity. A molding surrounds the chip carrier at least in places. The chip carrier extends completely through the molding in a vertical direction perpendicular to the radiation passage face.

12 Claims, 5 Drawing Sheets

(51) Int. Cl.
  *H01L 33/54* (2010.01)
  *H01L 33/64* (2010.01)
  *H01L 23/00* (2006.01)
  *H01L 33/60* (2010.01)

(52) U.S. Cl.
  CPC ............ *H01L 2224/48247* (2013.01); *H01L 2224/48465* (2013.01); *H01L 2224/73265* (2013.01); *H01L 2224/92247* (2013.01); *H01L 2224/97* (2013.01); *H01L 2924/12041* (2013.01); *H01L 2924/12042* (2013.01); *H01L 2924/1715* (2013.01); *H01L 2924/181* (2013.01); *H01L 2924/18301* (2013.01); *H01L 2933/005* (2013.01); *H01L 2933/0033* (2013.01); *H01L 2933/0066* (2013.01)

(56) References Cited

U.S. PATENT DOCUMENTS

| | | | |
|---|---|---|---|
| 6,900,511 B2 | 5/2005 | Ruhnau et al. | |
| 6,949,771 B2 | 9/2005 | Yoganandan et al. | |
| 7,557,384 B2 | 7/2009 | Matsumoto et al. | |
| 9,240,536 B2 * | 1/2016 | Zitzlsperger | H01L 33/486 |
| 2001/0042915 A1 * | 11/2001 | Su | H01L 21/565 |
| | | | 257/734 |
| 2002/0163006 A1 | 11/2002 | Yoganandan et al. | |
| 2003/0107316 A1 | 6/2003 | Murakami et al. | |
| 2004/0011699 A1 * | 1/2004 | Park | H01L 23/49537 |
| | | | 206/710 |
| 2004/0140764 A1 | 7/2004 | Lin et al. | |
| 2004/0188790 A1 | 9/2004 | Arndt et al. | |
| 2005/0057883 A1 * | 3/2005 | Bolken | H01L 21/4803 |
| | | | 361/301.3 |
| 2005/0151149 A1 | 7/2005 | Chia et al. | |
| 2005/0184404 A1 * | 8/2005 | Huang | H01L 27/14683 |
| | | | 257/787 |
| 2006/0102917 A1 * | 5/2006 | Oyama | H01L 33/60 |
| | | | 257/99 |
| 2006/0180824 A1 | 8/2006 | Kim et al. | |
| 2007/0069418 A1 | 3/2007 | Liao et al. | |
| 2009/0212316 A1 | 8/2009 | Braune et al. | |
| 2009/0218584 A1 | 9/2009 | Bogner | |
| 2010/0001306 A1 | 1/2010 | Park et al. | |
| 2011/0074000 A1 | 3/2011 | Jaeger et al. | |
| 2012/0098110 A1 | 4/2012 | Zitzlsperger et al. | |

FOREIGN PATENT DOCUMENTS

| | | |
|---|---|---|
| CN | 101523621 A | 9/2009 |
| DE | 10229067 A1 | 1/2004 |
| DE | 102005041064 A1 | 3/2007 |
| DE | 102008038748 A1 | 2/2010 |
| DE | 102008051928 A1 | 4/2010 |
| DE | 102008053489 A1 | 4/2010 |
| EP | 1253650 A2 | 10/2002 |
| JP | 0550754 U | 7/1993 |
| JP | 2003174200 A | 6/2003 |
| JP | 2006278934 A | 10/2006 |
| JP | 2007109887 A | 4/2007 |
| JP | 2010003877 A | 1/2010 |
| WO | 9712386 A2 | 4/1997 |
| WO | 2007038536 A2 | 4/2007 |
| WO | 2009072757 A2 | 6/2009 |
| WO | 2009143789 A1 | 12/2009 |
| WO | 2010017790 A1 | 2/2010 |

* cited by examiner

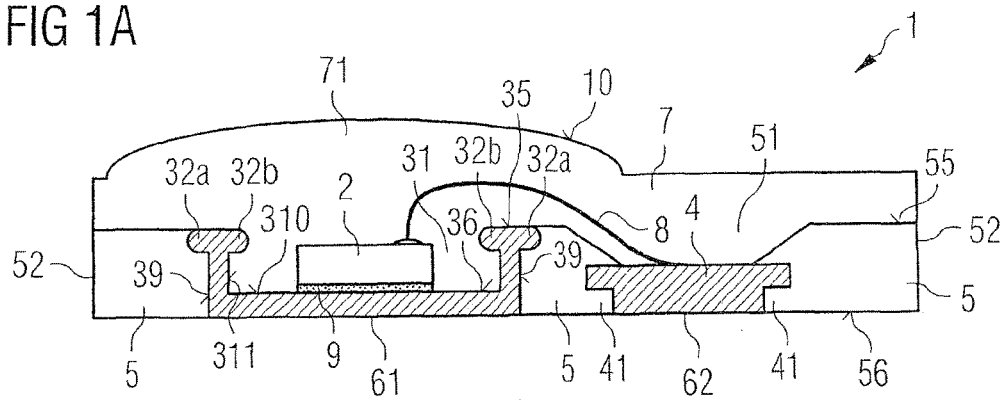
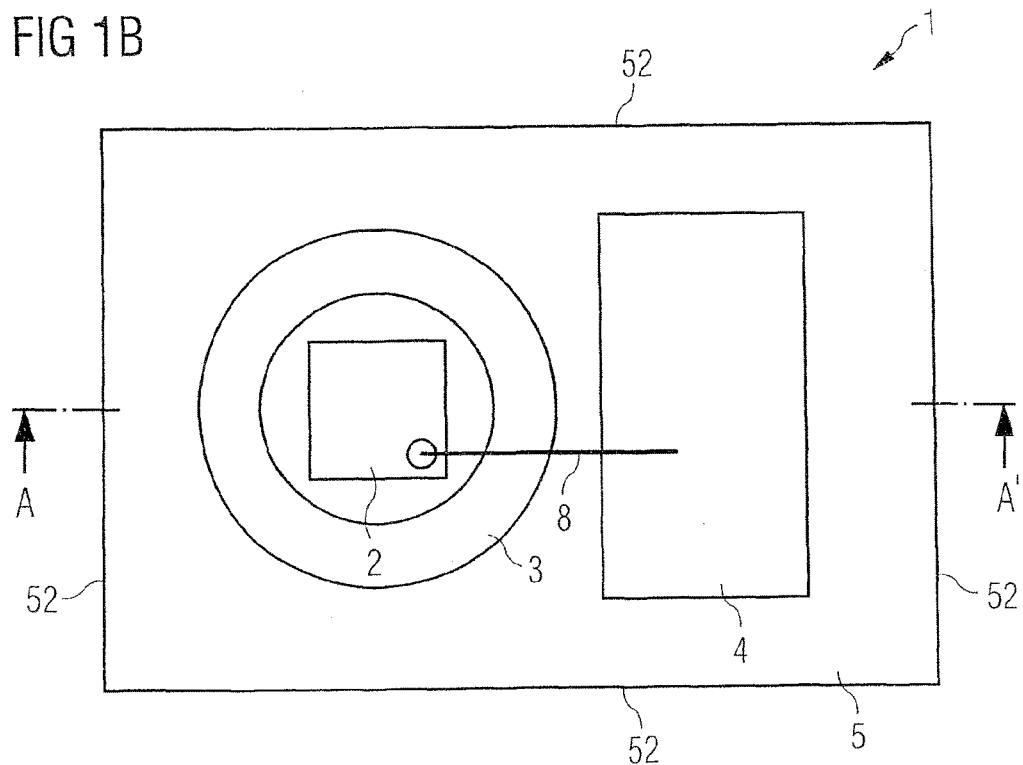

SURFACE-MOUNTABLE OPTOELECTRONIC COMPONENT AND METHOD FOR PRODUCING A SURFACE-MOUNTABLE OPTOELECTRONIC COMPONENT

This application is a divisional of U.S. patent application Ser. No. 13/702,000, filed on Feb. 10, 2013, titled "Surface-Mountable Optoelectronic Component and Method for Producing a Surface-Mountable Optoelectronic Component," which is a national phase filing under section 371 of PCT/EP2011/058583, filed May 25, 2011, which claims the priority of German patent application 10 2010 023 815.5, filed Jun. 15, 2010, each of which are incorporated herein by reference in their entirety.

TECHNICAL FIELD

A surface-mountable optoelectronic component and a method for producing such a component are specified.

BACKGROUND

When producing surface-mountable semiconductor components (surface mounted device, SMD), for example light-emitting diodes, the optoelectronic semiconductor chips may be placed in a prefabricated housing with a metallic lead frame. The semiconductor chips are typically mounted by adhesion with conductive silver adhesive, which restricts the dissipation of waste heat and thus LED performance.

SUMMARY OF THE INVENTION

In one aspect, the present application provides a surface-mountable component in which the waste heat generated during operation may be efficiently dissipated and which may moreover be easily, inexpensively and reliably produced. A method for producing such a component is also disclosed.

According to one embodiment, a surface-mountable optoelectronic component comprises a radiation passage face, an optoelectronic semiconductor chip and a chip carrier. Formed in the chip carrier is a cavity in which the semiconductor chip is arranged. A molding surrounds the chip carrier at least in places. The chip carrier extends completely through the molding in a vertical direction perpendicular to the radiation passage face.

The waste heat generated when the semiconductor chip is in operation may thus be dissipated directly from the semiconductor chip via the chip carrier out of the component. In the vertical direction the chip carrier extends between a top facing the radiation passage face and a bottom. The cavity is conveniently formed in the top of the chip carrier.

The semiconductor chip is preferably bonded to the chip carrier. In the case of a bonded joint, the joint components, which are preferably prefabricated, are held together by means of atomic and/or molecular forces. A bonded joint may for example be achieved by means of a bonding agent, for instance an adhesive or a solder. As a rule, separation of the joint is accompanied by destruction of the bonding agent, for instance a bonding layer, and/or at least of one of the joint components.

The bonding layer formed between the chip carrier and the semiconductor chip is preferably a solder layer. A solder layer is distinguished by a particularly high thermal conductivity, such that the thermal resistance between semiconductor chip and chip carrier is reduced and thus heat dissipation out of the semiconductor chip is improved to a greater extent.

The molding preferably contains a plastics material or consists of a plastics material. Such a material may be easily, reliably and cheaply molded onto the chip carrier during production of the component.

The semiconductor chip is preferably arranged completely inside the cavity, i.e., the semiconductor chip preferably does not project beyond the top of the chip carrier.

In addition to the optoelectronic semiconductor chip, the component may also comprise a further semiconductor chip, in particular an electronic or optoelectronic semiconductor chip. The further semiconductor chip may be arranged in the cavity or in a further cavity.

In a preferred configuration, the molding is formed in the vertical direction completely between a first main plane predetermined by the top of the chip carrier and a second main plane predetermined by the bottom of the chip carrier. In other words, the maximum thickness of the molding is less than or equal to the thickness of the chip carrier. In this context, "thickness" means the extent in the vertical direction.

Furthermore, the molding preferably terminates flush with the bottom of the chip carrier and/or the top of the chip carrier in the vertical direction at least in a region adjoining the chip carrier. Furthermore, the molding may completely surround the chip carrier in the lateral direction and may in particular terminate flush with the top and the bottom of the chip carrier in the entire region around the chip carrier.

In a preferred configuration, a contact structure is arranged in the molding. The contact structure preferably extends vertically completely through the molding. The contact structure is conveniently connected electrically conductively with the semiconductor chip via a connecting line, for instance a wire bond connection. By means of the contact structure, the semiconductor chip is electrically contactable externally from the side remote from the radiation exit face.

The connecting line preferably extends in places between the first main plane and the radiation passage face. In the vertical direction the connecting line thus projects above the molding and moreover also the chip carrier in places. In this case, in plan view onto the component the connecting line bridges a lateral distance between the chip carrier and the contact structure.

In a further preferred configuration the chip carrier forms a first contact, via which the semiconductor chip may be electrically contacted externally. In this case the contact structure may form a further contact, wherein the first contact and the further contact are preferably arranged on the side of the component remote from the radiation passage face.

It is alternatively also conceivable for the chip carrier not to be intended for external electrical contacting, but rather in particular to serve for heat dissipation. In this case the component conveniently comprises at least one further contact structure, such that the component provides at least two external electrical contacts.

In one preferred configuration a base surface of the cavity comprises a first coating. The first coating is in particular intended to simplify a soldered connection with the optoelectronic semiconductor chip. The first coating thus simplifies the production of a connection between the chip carrier and the semiconductor chip with low heat resistance. The first coating preferably consists of gold or of a metal alloy containing gold.

In a further preferred configuration, a side face of the cavity is configured to be reflective to radiation to be generated and/or received by the optoelectronic semiconductor chip during operation of the optoelectronic component.

In particular, the side face may comprise a second coating. The second coating preferably contains a metal or a metal alloy. In the visible spectral range and in the ultraviolet spectral range, silver, aluminum, rhodium and chromium are distinguished by high reflectivity, for example. In the infrared spectral range gold is suitable for the second coating, for example.

Alternatively or in addition, the chip carrier may also contain a plastics material. To increase reflectivity, a filler, for instance titanium dioxide, may be introduced into the plastics material.

In one preferred configuration, the optoelectronic semiconductor chip is embedded in a covering. The covering serves to encapsulate the semiconductor chip and protects it from adverse external influences, for example moisture or dust. Preferably the covering also covers the molding at least in places. In the vertical direction the covering additionally preferably extends beyond the first main plane of the molding in the direction of the radiation passage face. In particular, the radiation passage face may be formed by the covering. The covering may for example be lenticular at least in places, for instance convexly curved in plan view onto the component. The covering is conveniently transparent or at least translucent to the radiation to be generated and/or received in the optoelectronic semiconductor chip.

In one preferred further development, the chip carrier comprises an anchoring structure, onto which the covering and/or the molding is molded. The anchoring structure is provided permanently to prevent or at least make more difficult detachment of the covering and/or of the molding from the chip carrier.

For example, the chip carrier may comprise an undercut when viewed from the radiation exit face.

In particular, an anchoring structure for the molding may take the form of a bead, which surrounds the chip carrier in the lateral direction completely or at least in places.

An anchoring structure for the covering may in particular be provided in the cavity or adjoin the cavity.

In a further preferred configuration, the covering and the molding terminate flush at least in a direction extending along the radiation passage face. Preferably, the covering and the molding terminate flush with one another over the entire circumference of the component. During production, such a component may be singulated particularly simply from a matrix of neighboring component regions by severing covering and molding in a joint manufacturing step.

In a method for producing a surface-mountable optoelectronic component, according to one embodiment a chip carrier is provided, in the top of which a cavity is formed. An optoelectronic semiconductor chip is arranged and conveniently fixed in the cavity. The chip carrier is arranged on an auxiliary carrier. The auxiliary carrier with the chip carrier is arranged in a forming mold, the cavity being closed hermetically by means of the forming mold and the top of the chip carrier. The forming mold is filled with a molding composition, the molding composition being molded at least in places onto the chip carrier outside the cavity. The forming mold is removed. The auxiliary carrier is removed.

The method is preferably carried out in the stated sequence of production steps. However, sequences which differ therefrom are also feasible. For example, arrangement of the semiconductor chip in the cavity may also take place only after molding of the molding composition onto the chip carrier.

"Closed hermetically" is understood in this connection to mean that the molding composition does not penetrate into the cavity of the chip carrier during filling of the forming mold. The chip carrier and the forming mold preferably adjoin one another directly in a region surrounding the cavity.

The described method allows a plurality of optoelectronic components to be produced simultaneously. The components arranged adjacent one another may be singulated, in particular by severing the molding composition, for instance by sawing. This conveniently takes place after removal of the forming mold.

The chip carrier is conveniently self-supporting, i.e., the chip carrier may, in particular together with the optoelectronic semiconductor chip already mounted on the chip carrier, be placed simply and reliably on the auxiliary carrier.

In one preferred configuration, a contact structure is provided on the auxiliary carrier. The contact structure is preferably provided as a lead frame.

Furthermore, the contact structure is preferably prefabricated on the auxiliary carrier, in particular before the chip carrier is placed on the auxiliary carrier.

In one preferred further development, the contact structure is vertically patterned. The contact structure may exhibit different thicknesses due to this patterning. When the molding composition is molded onto the contact structure, this may bring about better interlocking of contact structure and molding, so improving the mechanical robustness of the component.

During filling of the forming mold, the contact structure and the chip carrier may be permanently and robustly joined together mechanically by means of the molding composition used for the molding.

After removal of the forming mold, the semiconductor chip may be connected electrically conductively to the contact structure with a connecting line. This may proceed for example by means of a wire bonding method.

In one preferred configuration, the chip carrier comprises an outer side face, which extends from the top to the bottom of the chip carrier. The outer side face is preferably completely surrounded by the molding composition.

The molding is preferably produced by injection molding or transfer molding. In principle, all production methods are suitable which allow the forming mold to be simply and reliably filled.

After removal of the forming mold, the semiconductor chip is preferably provided with a covering. The covering may cover the molding at least in places, preferably completely. When singulating the components, the covering may be severed together with the molding. This results in a plurality of optoelectronic components, in which the covering and the molding terminate flush with one another along an edge of the component.

The above-described method is particularly suitable for producing an optoelectronic semiconductor chip described further above. Features listed in connection with the component may therefore also be used for the method and vice versa.

BRIEF DESCRIPTION OF THE DRAWINGS

Further features, configurations and convenient aspects are revealed by the following description of the exemplary embodiments in conjunction with the figures, in which:

FIGS. 1A and 1B show a first exemplary embodiment of a surface-mountable optoelectronic semiconductor chip in schematic plan view (FIG. 1B) and associated sectional view (FIG. 1A);

Identical, similar or identically acting elements are provided with the same reference numerals in the figures.

Figure 2:
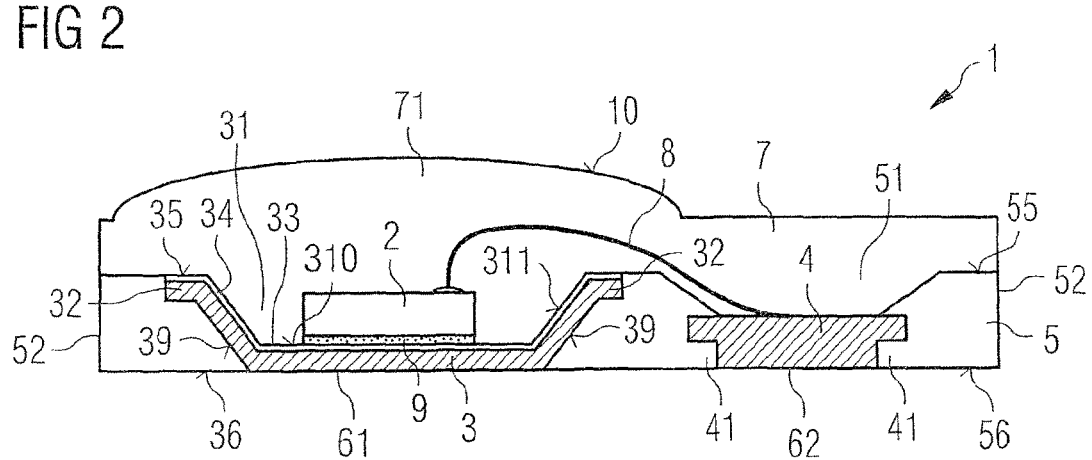
FIG. 2 is a schematic sectional view of a second exemplary embodiment of a surface-mountable optoelectronic component.

The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

FIGS. 1A and 1B are schematic representations of a first exemplary embodiment of a surface-mountable optoelectronic component 1 in schematic plan view (FIG. 1B) and associated schematic sectional view along the line A-A' (FIG. 1A).

The surface-mountable optoelectronic component 1 comprises a semiconductor chip 2, which is arranged in a cavity 31 of a chip carrier 3. The semiconductor chip 2 is joined mechanically robustly to a base surface 310 of the chip carrier 3 by means of a bonding layer 9.

The bonding layer 9 preferably takes the form of a solder layer and brings about particularly efficient thermal bonding of the semiconductor chip to the chip carrier 3, in particular compared to an adhesive bond.

The cavity is formed in the top 35 of the chip carrier 3 facing a radiation passage face 10 of the component. On the bottom 36 opposite the top, the chip carrier 3 forms a first contact 61 provided for external electrical contacting.

In the lateral direction, i.e., in a direction extending perpendicular to the vertical direction, the chip carrier 3 is surrounded by a molding 5. In a vertical direction, i.e., perpendicular to the radiation passage face 10 and thus parallel to a main radiation passage direction, the molding 5 terminates flush with the top 35 and with the bottom 36. The molding 5 is molded onto an outer side face 39 of the chip carrier 3 and completely covers the outer side face.

A contact structure 4 is additionally arranged in the molding 5. The contact structure 4 forms an externally accessible further contact 62 on the side remote from the radiation passage face 10. The contact structure 4 is connected electrically conductively to the semiconductor chip 2 by means of a connecting line 8 in the form of a wire bond connection. When the semiconductor chip is in operation, charge carriers may be injected into the semiconductor chip or flow away therefrom via the first contact 61 and the further contact 62.

The contact structure 4 is spaced laterally from the chip carrier 3. A mechanically robust connection between chip carrier and contact structure is brought about merely via the molding 5.

The lateral distance between the chip carrier 3 and the contact structure 4 is bridged by the connecting line 8. The connecting line projects beyond the top 35 of the chip carrier and extends between the top and the radiation passage face 10 in the region between the chip carrier and the contact structure 4. In this way, it is possible to dispense with an additional recess in the molding 50 for the connecting line.

In the region of the contact structure 4 the molding 5 comprises a recess 51, such that the contact structure is accessible on the side facing the radiation passage face for connecting the connecting line 8.

The contact structure 4 further comprises a peripheral undercut 41, the thickness of the contact structure being smaller than in the region of the second contact 62. The undercut assists in improved interlocking between the molding 5 and the contact structure.

The contact structure 4 extends vertically completely through the molding. Thus, the contact structure is electrically contactable inside the component 1 on the side of the radiation exit face 10 and externally on the side remote from the radiation exit face. In the vertical direction the thickness of the contact structure is preferably less than the thickness of the chip carrier 3. In this way the material requirement for the contact structure may be reduced.

The chip carrier 3 comprises an anchoring structure 32 with an outer anchoring structure 32a. The outer anchoring structure extends along the outer side face 39 of the chip carrier and serves to anchor the chip carrier 3 in the molding 5.

Furthermore, an inner anchoring structure 32b is provided on a side face 311 of the cavity 31.

The optoelectronic component 1 further comprises a covering 7, which encapsulates the semiconductor chip 2. In addition, the connecting line 8 in the form of a wire bond connection is provided in the covering. The covering thus serves in particular to protect the semiconductor chip and the connecting line from mechanical damage and further adverse external influences such as moisture or dust.

The mechanical robustness of the connection between the covering 7 and the chip carrier 3 may be improved by means of the inner anchoring structure 32b. The risk of detachment of the covering may thus be reduced as far as possible.

The molding 5 extends vertically between a first main plane 55 and a second main plane 56. These main planes are each predetermined by the top 35 and the bottom 36 of the chip carrier 3 respectively.

The connecting line 8 extends vertically in places between the first main plane 55 and the radiation exit face 10. The connecting line thus projects above the first main plane.

The radiation exit face 10 is formed by means of the covering 7. One region of the covering takes the form of a lens 71 for the radiation to be generated and/or detected in the optoelectronic semiconductor chip when in operation.

The covering 7 is conveniently transparent or at least translucent to the radiation. Preferably, the covering contains a silicone, an epoxide or a mixture of silicone and epoxide or consists of such a material or a mixture of such a material.

Light-scattering or reflective particles and/or a luminescence conversion material may additionally be provided in the covering.

The material for the molding 5 may, on the other hand, be selected largely independently of its optical properties and may in particular also be absorbent for the radiation. The molding 5 preferably contains a plastics material or consists of plastics material.

The molding 5 is defined laterally by an edge 52. Along the edge, the molding 5 and the covering 7 terminate flush with one another, preferably over the entire circumference of the component.

In this exemplary embodiment the chip carrier 3 is formed of an electrically conductive material, preferably of a metal, for example copper, aluminium, silver, or gold, or of a metal alloy with at least one such metal.

Unlike in the exemplary embodiment described, the chip carrier 3 may however also be of electrically insulating construction. In this case, the component 1 conveniently comprises a further contact structure, such that the contact structure 4 and the further contact structure (not explicitly shown) form two external contacts for the component 1.

In the case of an electrically insulating chip carrier 3, a ceramic, for instance aluminium nitride or boron nitride, or a plastics material, for instance a silicone, may be used, for example. To increase reflection, the plastics material may be filled, for example with titanium dioxide. A ceramic may be distinguished by high thermal conductivity.

The semiconductor chip 2 is provided completely within the cavity 31 of the chip carrier 3. It thus does not project beyond the top 35 of the chip carrier.

The optoelectronic semiconductor chip 2 may for example take the form of an LED chip, a laser chip or a radiation detector chip.

The semiconductor chip preferably contains a III-V semiconductor material. III-V semiconductor materials are particularly suitable for producing radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) as far as into the infrared ($Al_xIn_yGa_{1-x-y}As$) range of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V semiconductor materials, in particular from the stated material systems, it is additionally possible to achieve high internal quantum efficiencies in the generation of radiation.

A second exemplary embodiment of an optoelectronic component is illustrated schematically in sectional view in FIG. 2. This second exemplary embodiment substantially corresponds to the first exemplary embodiment described in connection with FIG. 1.

In contrast therewith, the cavity 31 of the chip carrier 3 is constructed in the manner of a reflector. A side face 311 of the cavity 31 preferably forms an angle of 20° to 70° inclusive with the base surface 310 of the cavity.

The chip carrier 3 takes the form of a coated body, for example a coated copper body.

The base surface 310 is formed by means of a first coating 33. The first coating is preferably provided for simplified production of a soldered joint between the chip carrier 3 and the semiconductor chip 2. The first coating preferably consists of gold or a gold-containing alloy.

The side face 311 is formed by means of a second coating 34. The second coating 34 preferably exhibits high reflectivity, preferably of 60% or more, for radiation to be generated and/or detected in the semiconductor chip when in operation. The second coating preferably contains a metal or a metal alloy. Silver, aluminium, rhodium or chromium are for example distinguished by high reflectivity in the visible and in the ultraviolet spectral ranges. Gold is suitable in particular for radiation in the infrared spectral range.

The above-described multilayer configuration of the chip carrier 3 may also be used in the first exemplary embodiment described in connection with FIG. 1.

In this exemplary embodiment the anchoring structure 32 merely serves in anchoring the chip carrier 3 in the molding 5. As described in connection with FIG. 1A, however, unlike in the described exemplary embodiment, an anchoring structure may also be provided for the covering 7.

One exemplary embodiment of a method for producing a surface-mountable optoelectronic component is shown in FIGS. 3A to 3F using intermediate steps illustrated schematically in sectional view. For a better view, FIGS. 3A to 3F show just part of a component assembly, which results in one component during production. A plan view onto a component assembly 11 before it is singulated into components is shown in plan view in FIG. 4.

Figure 3A:
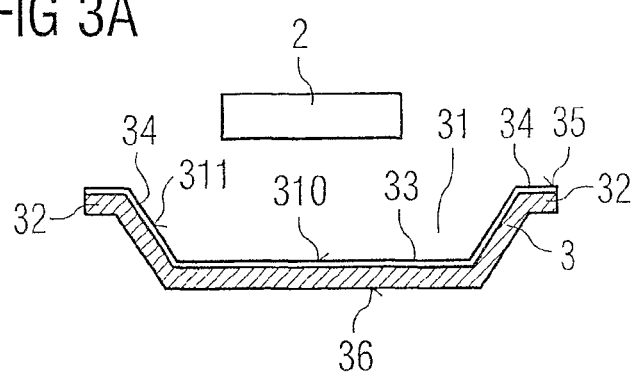
FIGS. 3A to 3F show an exemplary embodiment of a method for producing an optoelectronic component using intermediate steps illustrated schematically in sectional view.
Figure 3B:
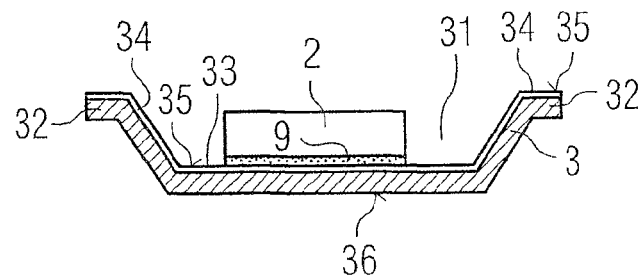
Figure 3C:
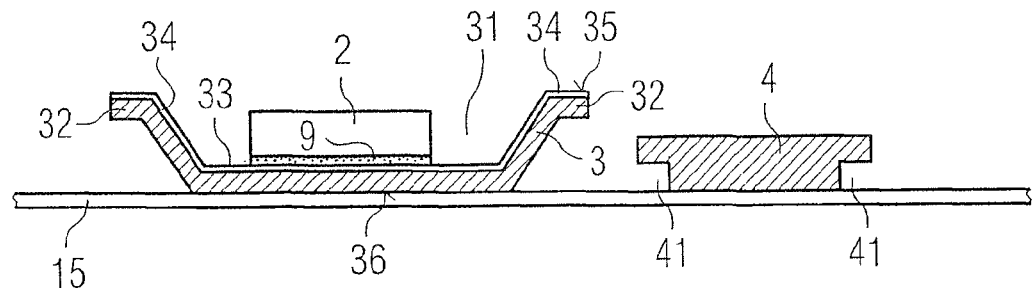

As FIG. 3A shows, a chip carrier 3 is provided, which comprises a top 35 and a bottom 36. At the top 35, a cavity 31 is formed in the chip carrier 3. In addition, an optoelectronic semiconductor chip 2 is provided. The optoelectronic semiconductor chip 2 is joined electrically conductively and mechanically robustly to the inside of the cavity 31 of the chip carrier 3 by means of a bonding layer 9. As described in connection with FIG. 2, the chip carrier 3 comprises a coating at least in the region of a base surface 310 of the cavity 31, such that the semiconductor chip 2 may be soldered to the chip carrier.

The chip carrier 3 with the semiconductor chip 2 is arranged on an auxiliary carrier 15. An example of a suitable material for the auxiliary carrier is a plastics film, which preferably has adhesive properties at least on the side facing the chip carrier 3.

A contact structure 4 is additionally arranged on the auxiliary carrier 15. The contact structure is preferably provided on the auxiliary carrier prior to fixing of the semiconductor chip 2 to the auxiliary carrier.

Figure 3D:
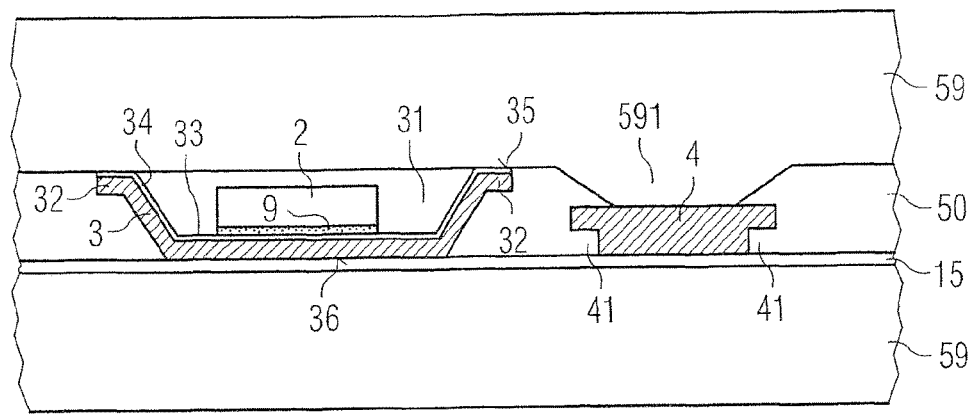

The auxiliary carrier with the chip carrier 3 and the contact structure 4 is arranged in a forming mold 59 (FIG. 3D). The chip carrier 3 and the forming mold 59 are conformed to one another in such a way that the top of the chip carrier 35 and the forming mold 59 adjoin one another directly and tightly enclose the cavity 31. When the forming mold 59 is filled with a molding composition 50, the molding composition is thus molded onto the chip carrier 3, without penetrating into the cavity 31.

In the region of the contact structure 4 the forming mold 59 comprises a projection 591. The projection 591 directly adjoins the contact structure 4, such that the contact structure 4 remains free of the molding composition in the region of the projection. Filling of the forming mold 59 preferably proceeds by means of a molding or injection method, for example by means of injection molding or transfer molding.

After curing or at least partial curing of the molding composition 50, the forming mold 59 may be removed. By means of the resultant molding 5, the contact structure 4 is then joined mechanically robustly to the chip carrier 3.

After removal of the forming mold the auxiliary carrier 15 may also be removed.

Figure 3E:
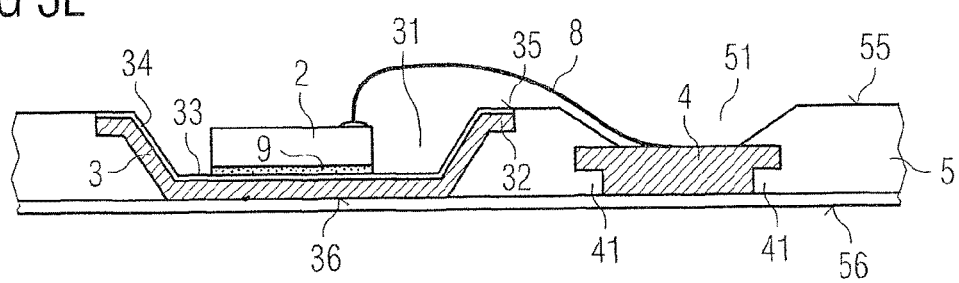

The semiconductor chip 2 and the contact structure 4 are connected electrically conductively together with a connecting line 8, for example a wire bond connection (FIG. 3E).

Once the electrical connection has been produced, the semiconductor chip 2 and the molding 5 may be provided with a covering 7. The covering may be produced by means of a further injection molding method or of a transfer molding method.

The covering 7 is preferably configured such that it completely covers the semiconductor chip and the connecting line 8. The entire molding 5 is additionally preferably covered by the covering.

Once the covering has been formed, the component assembly 11 may be singulated into individual components by severing the molding 5 and the covering 7, for example by sawing.

Figure 3F:
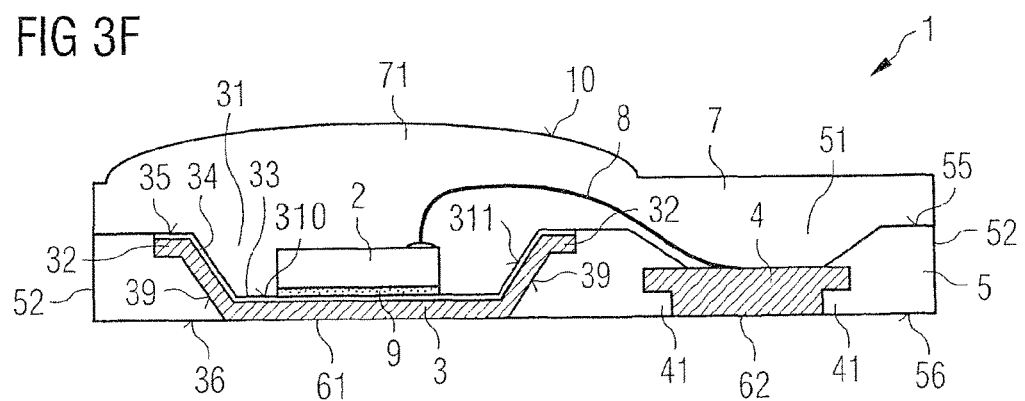

The method has been described by way of example with reference to production of a component, constructed as described in connection with FIG. 2 (FIG. 3F). It goes without saying that the method is also suitable for producing a component according to the first exemplary embodiment described with reference to FIGS. 1A and 1B.

Figure 4:
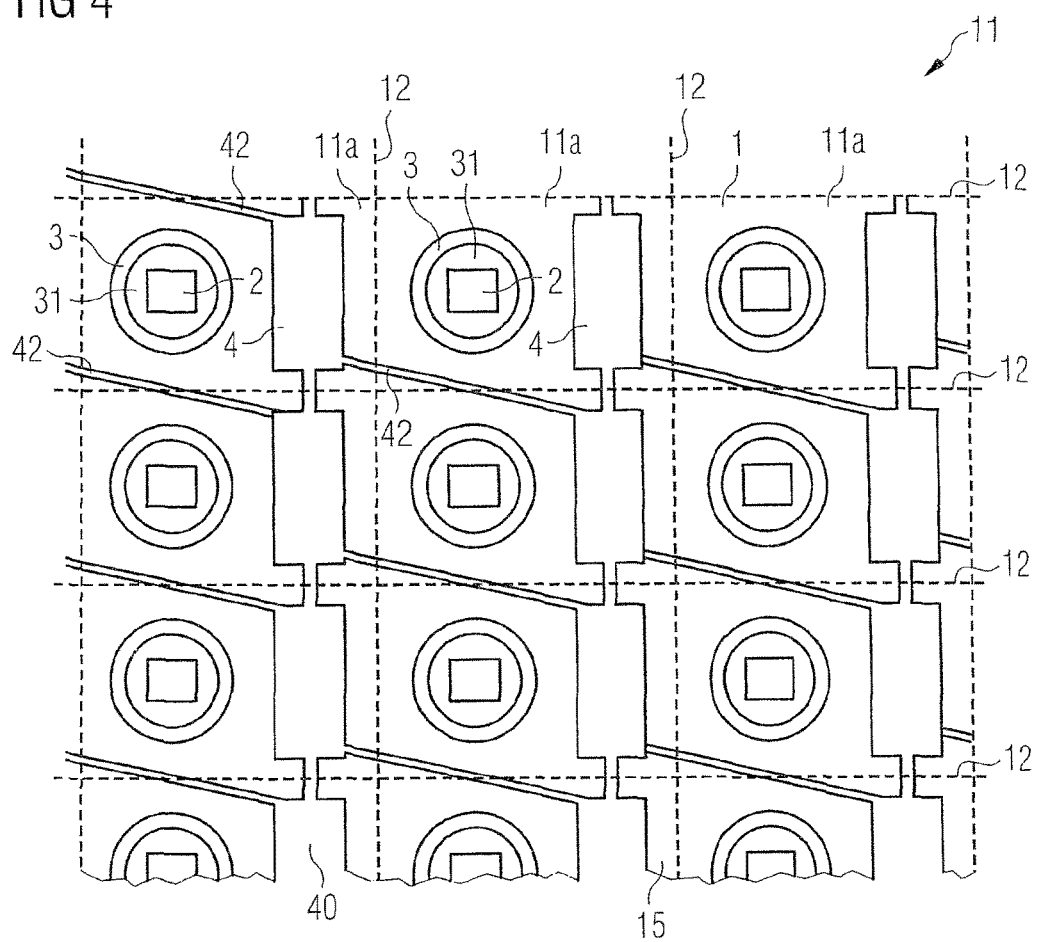
FIG. 4 shows an exemplary embodiment of a component assembly for producing an optoelectronic component.

FIG. 4 is a schematic plan view of a component assembly 11 prior to singulation into components.

A contact structure assembly 40 is provided on the auxiliary carrier 15. In the contact structure assembly, the individual contact structures 4 for the subsequent components are joined together by means of webs 42. The contact structure assembly thus forms a contiguous assembly for the contact structures 4. The contact structure assembly may for example take the form of a metal sheet for a lead frame. The metal sheet may for example be stamped, embossed or etched. In particular, the metal sheet may contain copper or consist of copper. A composite material, for instance a "flex substrate," or a rigid or flexible printed circuit board (PCB) may also be used.

On singulation of the component assembly 11, the individual component regions 11a with in each case at least one semiconductor chip 2, one chip carrier 3 and one contact structure 4 are singulated along the dashed separation lines 12.

In the above-described method, the optoelectronic semiconductor chips 2 may be fixed to the chip carriers 3 before the molding 5 is formed. Unlike in the above-described exemplary embodiment, however, it is also conceivable for the semiconductor chips to be fixed in the chip carrier 3 only after molding of the molding 5 onto the chip carrier 3.

In both cases the electrically conductive connection may be produced between the semiconductor chip 2 and the chip carrier 3 by means of a soldered joint. To simplify production of the soldered joint, it is sufficient merely to provide the base surface 310 of the cavity 31 of the chip carrier 3 with a coating.

In contrast, the contact structure 4 is not intended for soldered connection and does not therefore have to meet any particular requirements in terms of bondability with a solder. The semiconductor chip 2 may thus be mounted by means of a soldered joint, without the need for extensive gold-plating of a lead frame. Instead, it is sufficient merely to provide the comparatively small surface area of the chip carrier 3 or the base surface thereof with such a coating. In this way, resources and thus costs may be saved during production, without impairing the reliability of the production method.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

What is claimed is:

1. A method for producing a surface-mountable component, the method comprising:
   providing a chip carrier, wherein a cavity is disposed in the chip carrier;
   arranging an optoelectronic semiconductor chip in the cavity and such that the optoelectronic semiconductor chip is fixed to a base surface of the cavity;
   arranging the chip carrier on an auxiliary carrier;
   forming a contact structure on the auxiliary carrier with the contact structure directly adjoining the auxiliary carrier, wherein, after the contact structure is formed, the contact structure is laterally spaced apart from the chip carrier without overlapping the chip carrier in a top view that is relative to the surface-mountable component;
   arranging the auxiliary carrier with the chip carrier in a forming mold, wherein the forming mold seals against a surface of the chip carrier such that the cavity is closed hermetically by the forming mold and a top surface of the chip carrier;
   providing a molding composition in a portion of the forming mold outside of the cavity, wherein, after providing the molding composition in the portion of the forming mold, the molding composition is molded at least in places onto the chip carrier outside the cavity, and wherein the chip carrier and the contact structure are joined together mechanically by the molding composition;
   removing the forming mold; and
   removing the auxiliary carrier.

2. The method according to claim 1, wherein the chip carrier comprises an outer side face that extends from the top to the bottom of the chip carrier, wherein the outer side face is completely surrounded by the molding composition.

3. The method according to claim 1, wherein filling the forming mold comprises injection molding or transfer molding.

4. The method according to claim 1, further comprising providing the semiconductor chip with a covering, wherein the covering completely covers the molding composition.

5. The method according to claim 4, wherein the covering is provided after removing the auxiliary carrier.

6. The method according to claim 4, wherein the chip carrier comprises an anchoring structure onto which the covering is molded.

7. The method according to claim 1, wherein the semiconductor chip is arranged completely within the cavity during the arranging the auxiliary carrier with the chip carrier in the forming mold.

8. The method according to claim 1, wherein the chip carrier comprises an anchoring structure onto which the molding composition is molded.

9. The method according to claim 1, wherein during fabrication of the surface-mountable component, the surface-mountable component is singulated from a matrix of neighboring component regions by severing the molding.

10. The method according to claim 9, wherein the method further comprises providing the semiconductor chips in the component regions with a covering, wherein the covering completely covers the molding composition; and
   wherein the molding composition and the covering are severed at a same time in a joint manufacturing process.

11. The method according to claim 9, wherein the components are severed by sawing.

12. A method for producing a surface-mountable component, the method comprising:
   providing a chip carrier, wherein a cavity is disposed in the chip carrier, and wherein the chip carrier has an inner anchoring structure disposed at an inner side face of the cavity;
   arranging an optoelectronic semiconductor chip in the cavity with the inner side face of the cavity facing the optoelectronic semiconductor chip;
   arranging the chip carrier on an auxiliary carrier;
   arranging the auxiliary carrier with the chip carrier in a forming mold, wherein the forming mold seals against a surface of the chip carrier such that the cavity is closed hermetically by the forming mold and a top surface of the chip carrier;

providing a molding composition in a portion of the forming mold outside of the cavity, wherein, after providing the molding composition in the portion of the forming mold, the molding composition is molded at least in places onto the chip carrier outside the cavity;

removing the forming mold;

providing the semiconductor chip with a covering directly adjoining the optoelectronic semiconductor chip, wherein the covering completely covers the molding composition, and wherein the covering is molded onto the inner anchoring structure; and removing the auxiliary carrier.

* * * * *